United States Patent
Chen et al.

(10) Patent No.: US 12,207,545 B2
(45) Date of Patent: Jan. 21, 2025

(54) PHOSPHORESCENT PtM2 (M=Cu,Ag,Au) COMPLEX AND ORGANIC LIGHT-EMITTING DIODE THEREOF

(71) Applicant: FUJIAN INSTITUTE OF RESEARCH ON THE STRUCTURE OF MATTER, CHINESE ACADEMY OF SCIENCES, Fujian (CN)

(72) Inventors: Zhongning Chen, Fujian (CN); Liyi Zhang, Fujian (CN); Linxi Shi, Fujian (CN); Jinyun Wang, Fujian (CN); Zhaoyi Wang, Fujian (CN)

(73) Assignee: FUJIAN INSTITUTE OF RESEARCH ON THE STRUCTURE OF MATTER, CHINESE ACADEMY, Fujian (CN)

( * ) Notice: Subject to any disclaimer, the term of this patent is extended or adjusted under 35 U.S.C. 154(b) by 767 days.

(21) Appl. No.: 17/405,229

(22) Filed: Aug. 18, 2021

(65) Prior Publication Data
US 2022/0059782 A1 Feb. 24, 2022

(30) Foreign Application Priority Data
Aug. 18, 2020 (CN) .......................... 202010833421.8

(51) Int. Cl.
| | |
|---|---|
| H10K 85/30 | (2023.01) |
| C07F 15/00 | (2006.01) |
| C09K 11/02 | (2006.01) |
| C09K 11/06 | (2006.01) |
| H10K 50/11 | (2023.01) |
| H10K 101/10 | (2023.01) |

(52) U.S. Cl.
CPC ....... *H10K 85/346* (2023.02); *C07F 15/0086* (2013.01); *C09K 11/02* (2013.01); *C09K 11/06* (2013.01); *C09K 2211/1014* (2013.01); *C09K 2211/185* (2013.01); *C09K 2211/188* (2013.01); *H10K 50/11* (2023.02); *H10K 2101/10* (2023.02)

(58) Field of Classification Search
CPC ................. H10K 85/346; H10K 50/11; H10K 2101/10; H10K 2101/90; H10K 85/361; H10K 85/371; H10K 50/12; H10K 71/00; C07F 15/0086; C07F 19/00; C09K 11/02; C09K 11/06; C09K 2211/1014; C09K 2211/185; C09K 2211/188; C09K 2211/1007; C09K 2211/1029; C09K 2211/1048; C09K 2211/1059; C09K 2211/1092
See application file for complete search history.

(56) References Cited

U.S. PATENT DOCUMENTS 11,233,206 B2 * 1/2022 Chen .................... H10K 85/371

OTHER PUBLICATIONS

Shu, H. X., Wang, J. Y., Zhang, Q. C., & Chen, Z. N. (2017). Photophysical and electroluminescent properties of PtAg2 acetylide complexes supported with meso-and rac-tetraphosphine. Inorganic Chemistry, 56(16), 9461-9473. (Year: 2017).*

Zhang, Q. C., Xiao, H., Zhang, X., Xu, L. J., & Chen, Z. N. (2019). Luminescent oligonuclear metal complexes and the use in organic light-emitting diodes. Coordination Chemistry Reviews, 378, 121-133. (Year: 2019).*

Wang, Zhao-Yi, et al. "Solution-Processed Organic Light-Emitting Diodes of Yellow-Emitting PtAg2 Complexes with an External Quantum Efficiency of 21.7%." Energy & Fuels 35.23 (2021): 19132-19138. (Year: 2021).*

(Continued)

*Primary Examiner* — Dawn L Garrett
(74) *Attorney, Agent, or Firm* — NKL Law; Allen Xue

(57) ABSTRACT

An ionic phosphorescent metal complex has a formula of formula (I). $R_1$ and $R_2$ are the same or different, and are independently selected from alkyl, aryl and heteroaryl, wherein the alkyl, aryl and heteroaryl are optionally substituted with 1-5 of the following groups: halogen, alkyl, alkoxy, alkylthio, amino, alkylamino, dialkylamino, arylamino, diarylamino, haloalkyl, cyano, nitro, alkenyl, aryl and heteroaryl optionally substituted with 1-3 aryl groups; $R_3$ is independently selected from halogen, alkyl, haloalkyl, alkoxy, alkylthio, amino, alkylamino, dialkylamino, cyano, nitro or alkenyl; M is Cu(I), Ag(I) or Au(I). The organic light-emitting diode prepared by using the phosphorescent metal complex of formula (I) as a dopant for an emissive layer is capable of achieving high-performance organic electroluminescence and is applicable to the fields of lighting and flat-panel display.

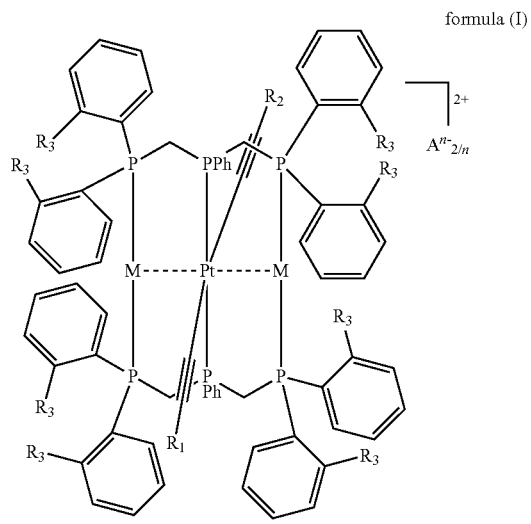

formula (I)

17 Claims, 1 Drawing Sheet

(56) References Cited

OTHER PUBLICATIONS

Wang, Zhao-Yi, et al. "Modulating the carrier transport of PtAg 2 heteronuclear complexes to attain highly efficient OLEDs with narrow-band emission." Journal of Materials Chemistry C 9.16 (2021): 5403-5410. (Year: 2021).*

Wang, Q., Wang, J. Y., Zeng, H., Zhang, L. Y., & Chen, Z. N. (2022). Sensitized ligand narrow-band phosphorescence for high-efficiency solution-processed OLEDs. Science China Chemistry, 65(8), 1559-1568. (Year: 2022).*

* cited by examiner

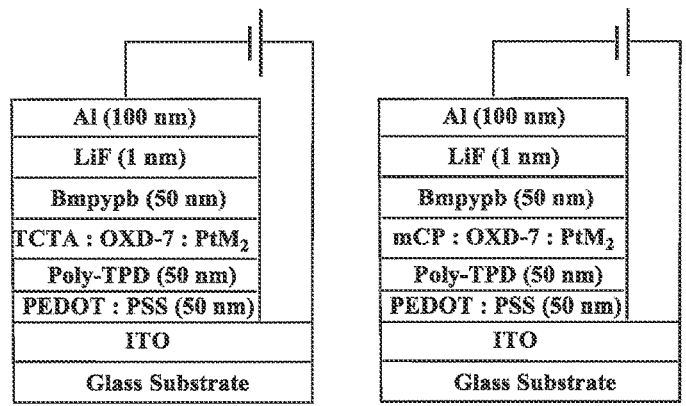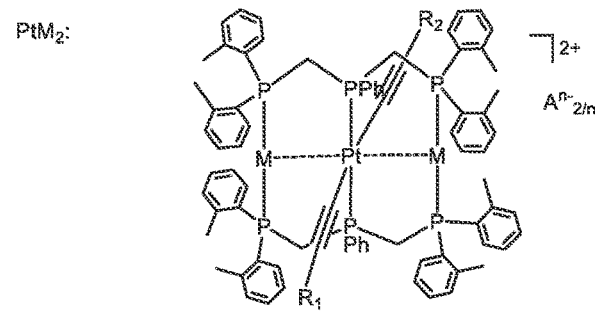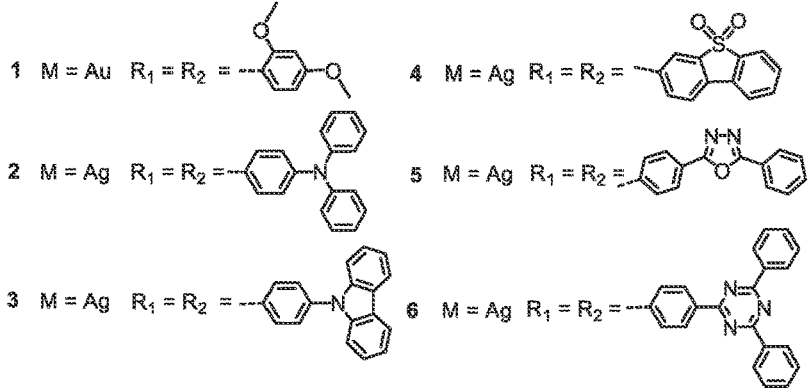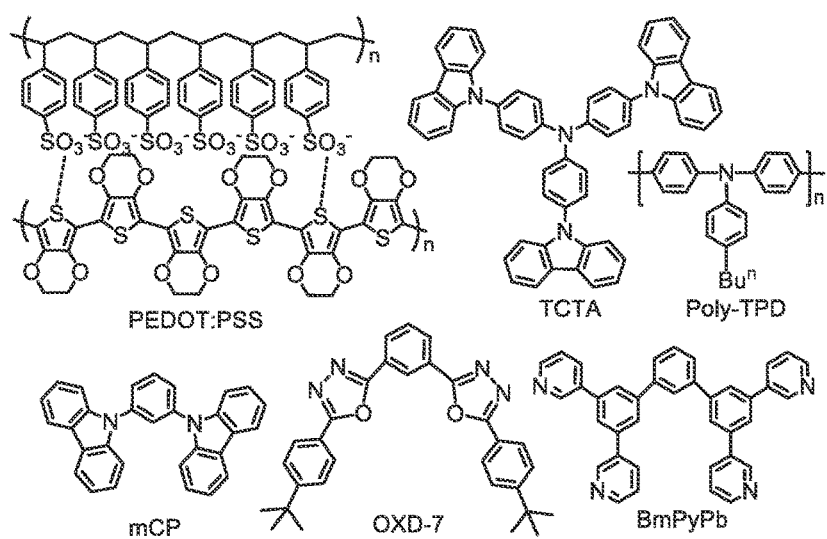

PHOSPHORESCENT PtM2 (M=Cu,Ag,Au) COMPLEX AND ORGANIC LIGHT-EMITTING DIODE THEREOF

TECHNICAL FIELD

The present invention relates to the field of organic electroluminescence and is applicable to the fields of color flat-panel display and lighting, and particularly relates to a novel PtM$_2$ (M=Cu, Ag, Au) heterotrinuclear complex light-emitting material and an organic light-emitting diode thereof, which results in high-efficiency organic electroluminescence.

BACKGROUND

Organic electroluminescence is a luminous phenomenon in which an organic light-emitting diode (OLED) directly converts electrical energy into light energy at a low DC voltage of 3-12 V, and is widely used in the fields of flat-panel display and lighting. Compared to conventional lighting and display technologies, OLEDs dominate in active self-luminescence, and have many advantages such as full-color display, wide viewing angle, high definition, fast response, low power consumption and low temperature resistance. Besides, organic light-emitting devices have excellent characteristics of being simple in structure, ultra-light, ultra-thin, flexible, foldable, etc.

The core of an organic light-emitting diode is the light-emitting material. At present, most of the phosphorescent materials used in commercial organic electroluminescent devices are neutral cyclometallic iridium (III) complexes, which are doped in organic host materials to form emissive layers. Electrically neutral iridium (III) complexes are suitable for coating in vacuum to prepare OLEDs due to their easy thermal evaporation in vacuum, but are difficult to form films by solution printing due to their solubility. On the contrary, although ionic phosphorescent metal complexes are difficult to evaporate, it is easy to increase their solubility and improve their carrier transport performance by changing counterions. Therefore, ionic phosphorescent metal complexes are more suitable to be prepared into luminescent inks for OLED printing, and they are easier to prepare, cheaper, more stable, and suitable to be printed into films by spin coating or large-area inkjet printing, and thus can greatly reduce the manufacturing costs of devices.

SUMMARY

One object of the present invention is to provide a group of PtM$_2$ ionic phosphorescent metal complexes supported by rigid triphosphine ligands and use thereof in organic light-emitting diodes.

Another object of the present invention is to provide an organic light-emitting diode comprising the above ionic phosphorescent metal complexes.

The objects of the present invention are achieved by the following scheme.

A phosphorescent metal complex of formula (I) below:

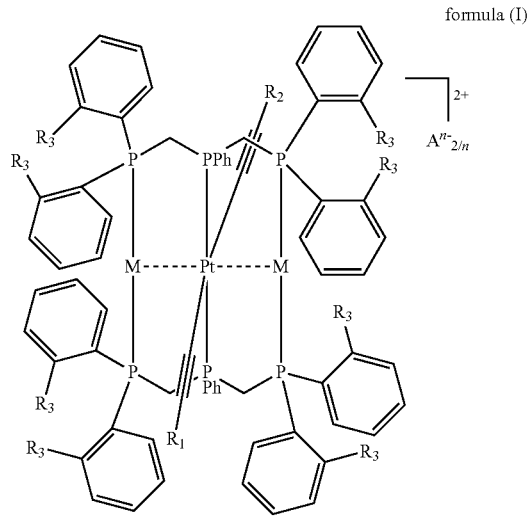

formula (I)

wherein R$_1$ and R$_2$ are the same or different, and are independently selected from aryl, heteroaryl and heteroaryl aryl, wherein the aryl and heteroaryl are optionally substituted with 1-5 of the following groups: halogen, alkyl, alkoxy, alkylthio, amino, alkylamino, dialkylamino, arylamino, diarylamino, haloalkyl, cyano, nitro, alkenyl, alkynyl, aryl and heteroaryl optionally substituted with 1-3 aryl groups;

R$_3$ is the same or different, and is independently selected from halogen, alkyl, haloalkyl, alkoxy, alkylthio, amino, alkylamino, dialkylamino, cyano, nitro, alkenyl and alkynyl;

M is Cu(I), Ag(I) or Au(I);

A$^{n-}$ is an anionic group, such as ClO$_4^-$, PF$_6^-$, SbF$_6^-$, BF$_4^-$, SiF$_6^{2-}$, CF$_3$SO$_3^-$, CF$_3$CF$_2$CF$_2$SO$_3^-$ and dicyclohexyl succinate-2-sulfonate, wherein n is 1 or 2.

According to the present invention, R$_1$ and R$_2$ are independently selected from aryl and heteroaryl, wherein the aryl and heteroaryl are optionally substituted with 1-3 of the following groups: alkyl, alkoxy, halogen, haloalkyl, amino, arylamino, diarylamino, aryl, heteroaryl and heteroaryl substituted with one or two aryl groups; the aryl can be phenyl, naphthyl, phenanthryl or anthryl; the heteroaryl can be heteroaryl containing a heteroatom selected from N, S and O, such as thienyl, furanyl, dibenzothienyl, oxodibenzothienyl, carbazolyl, oxadiazolyl and triazinyl.

According to the present invention, preferably, R$_1$ and R$_2$ are independently selected from heteroaryl, aryl, alkoxyaryl, dialkoxyaryl, trialkoxyaryl, heteroarylaryl, arylheteroarylaryl and diarylheteroarylaryl; such as methoxyaryl, dimethoxyaryl, trimethoxyaryl, carbazolylaryl, aryloxadiazolylaryl and diaryltriazinylaryl.

According to the present invention, preferably, R$_1$ and R$_2$ are independently selected from alkoxy-phenyl, dialkoxyphenyl, trialkoxy-phenyl, heteroaryl-phenyl, diarylaminophenyl, arylheteroarylphenyl and diarylheteroarylphenyl.

According to the present invention, preferably, R$_1$ and R$_2$ are independently selected from phenyl, naphthyl, carbazolyl, 2-methoxy-phenyl, 3-methoxy-phenyl, 4-methoxy-phenyl, 2,4-dimethoxy-phenyl, 3,4,5-trimethoxy-phenyl, diphenylaminophenyl, carbazolylphenyl, dibenzothienyl, oxodibenzothienyl, phenyloxadiazolylphenyl and di phenyl-v-triazinyl phenyl.

R$_3$ is independently selected from alkyl, such as methyl.

According to the present invention, preferably, $R_1$ and $R_2$ are the same.

According to the present invention, preferably, M is Ag(I) or Au(I); $A^{n-}$ is $CF_3SO_3^-$ or $ClO_4^-$; $R_3$ is methyl.

According to the present invention, the metal complex of formula (I) is selected from the following specific compounds:

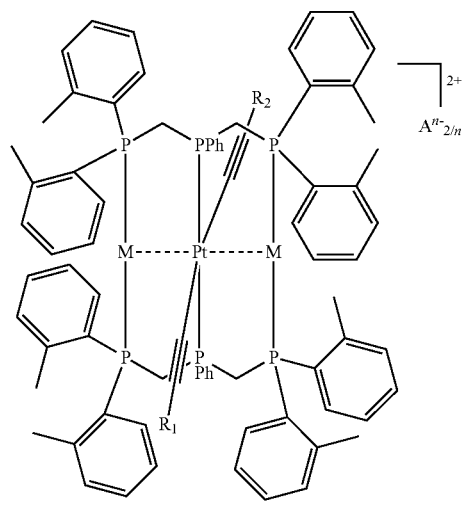

1  M = Au  $R_1 = R_2 =$ 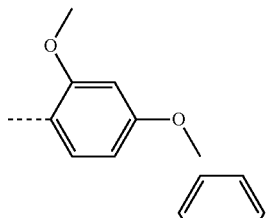

2  M = Ag  $R_1 = R_2 =$ 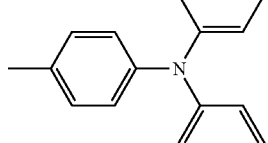

3  M = Ag  $R_1 = R_2 =$ 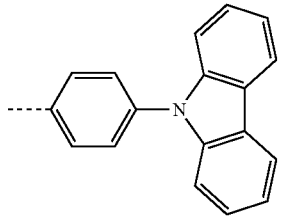

4  M = Ag  $R_1 = R_2 =$ 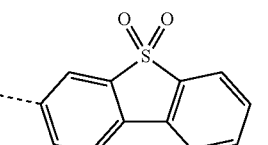

5  M = Ag  $R_1 = R_2 =$ 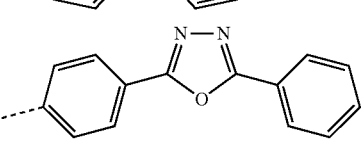

-continued

6  M = Ag  $R_1 = R_2 =$ 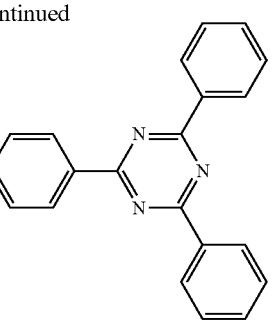

complex 1: $R_1$ and $R_2$ are the same, and are 2,4-dimethoxy-phenyl; M is Au;
complex 2: $R_1$ and $R_2$ are the same, and are 4-(diphenylamino)phenyl; M is Ag;
complex 3: $R_1$ and $R_2$ are the same, and are 4-(9H-carbazol-9-yl)phenyl; M is Ag;
complex 4: $R_1$ and $R_2$ are the same, and are dibenzo[b,d]thiophene-5,5-dioxide-3-yl; M is Ag;
complex 5: $R_1$ and $R_2$ are the same, and are 4-(5-phenyl-1,3,4-oxadiazol-2-yl)phenyl; M is Ag; and
complex 6: $R_1$ and $R_2$ are the same, and are 4-(4,6-diphenyl-1,3,5-triazin-2-yl)phenyl; M is Ag.

The present invention further provides a method for preparing the phosphorescent metal complex comprising: dissolving $PhP(CH_2P(C_6H_4R_3\text{-}2)_2)_2$ and $[M(tht)_2](A^{n-}{}_{1/n})$ in a solvent, and then adding platinum-organic alkyne complex $Pt(PPh_3)_2(C{\equiv}CR_1)(C{\equiv}CR_2)$ to the resultant solution to give the phosphorescent complex, wherein the tht refers to tetrahydrothiophene, and the M, $A^{n-}$, $R_1$, $R_2$, $R_3$ and n are defined as above.

According to the present invention, preferably, the solvent is a halohydrocarbon, such as dichloromethane.

According to the present invention, in the method, the molar ratio of $PhP(CH_2P(C_6H_4R_3\text{-}2)_2)_2$: $[M(tht)_2](A^{n-}{}_{1/n})$: $Pt(PPh_3)_2(C{\equiv}CR_1)(C{\equiv}CR_2)$ is (1.5-2.5):(1.5-2.5):(0.5-1.5), preferably 2:2:1.

According to the present invention, the reaction is performed at room temperature. Preferably, after the reaction is completed, separation and purification are performed by silica gel column chromatography.

The phosphorescent metal complex of the present invention exhibits strong phosphorescence in solution, solid and film, and can be used as a dopant for an emissive layer for preparing organic light-emitting diodes.

The present invention further provides use of the phosphorescent metal complex in organic light-emitting diodes.

The present invention further provides an organic light-emitting diode comprising an emissive layer, wherein the emissive layer comprises the phosphorescent metal complex of the present invention.

According to the present invention, in the emissive layer, the phosphorescent metal complex of the present invention is 3 wt %-20 wt %, preferably 5 wt %-10 wt %, of all materials, and more preferably, the phosphorescent complex of the present invention is doped at 6 wt % in the host material as the emissive layer.

According to the present invention, the organic light-emitting diode may have various structures known in the prior art, preferably including an anode layer, a hole injection layer, a hole transport layer, an emissive layer, an electron transport layer, an electron injection layer and a cathode layer. The organic light-emitting diode further comprises a substrate (for example, a glass substrate). The anode layer may be formed of indium tin oxide. The hole injection layer and the hole transport layer may be formed of PEDOT: PSS (poly(3,4-ethylenedioxythiophene)-poly(styrene sulfonic acid)) and Poly-TPD (poly(bis(4-phenyl)(4-butylphenyl) amine)). The emissive layer comprises the phosphorescent metal complex of the present invention, as well as TCTA (tris(4-(9-carbazole)phenyl)amine), mCP (1,3-bis(9-carbazolyl)benzene), CBP (4,4'-bis(9-carbazole)-1,1'-biphenyl) or 2,6-DCZPPY (2,6-bis(3-(9-carbazole)phenyl)pyridine) possessing hole transport properties and OXD-7 (1,3-bis(5-(4-(tert-butyl)phenyl)-1,3,4-oxadiazol-2-yl)benzene) possessing electron transport properties. The electron transport layer may be formed of TPBi (1,3,5-tris(1-phenyl-1H-benzo[d]imidazol-2-yl)benzene), BmPyPB (3,3",5,5"-tetra(3-pyridinyl)-1,1':3',1"-terphenyl), BCP (2,9-dimethyl-4,7-diphenyl-1,10-phenanthroline) or OXD-7. The electron injection layer is formed of LiF. The cathode layer is formed of Al.

According to the present invention, the device preferably has the following structure: ITO/PEDOT:PSS (50 nm)/Poly-TPD (50 nm)/mCP or TCTA:OXD-7:6 wt % of the complex of the present invention (50 nm)/BmPyPB (50 nm)/LiF (1 nm)/Al (100 nm), wherein ITO refers to indium tin oxide conductive film; PEDOT:PSS refers to poly(3,4-ethylenedioxythiophene)-poly(styrene sulfonic acid); Poly-TPD refers to (poly(bis(4-phenyl)(4-butylphenyl)amine)); TCTA refers to tris(4-(9-carbazole)phenyl)amine; OXD-7 refers to 1,3-bis(5-(4-(tert-butyl)phenyl)-1,3,4-oxadiazol-2-yl)benzene; BmPyPB refers to (3,3",5,5"-tetra(3-pyridinyl)-1,1':3',1"-terphenyl).

The present invention further provides a method for preparing the organic light-emitting diode comprising: 1) preparing a hole injection layer in the organic light-emitting diode on an anode by using solution method; 2) preparing a hole transport layer in the organic light-emitting diode on the hole injection layer by using solution method; 3) preparing an emissive layer doped with the phosphorescent metal complex of the present invention by using solution method; and 4) preparing an electron transport layer, an electron injection layer and a cathode layer sequentially by vacuum thermal evaporation.

In one preferred embodiment, the method comprises: first, preparing a hole injection layer on the anode by using water-soluble PEDOT:PSS; then, applying Poly-TPD in chlorobenzene solution to the PEDOT:PSS film to form a hole transport layer, mixing TCTA or mCP possessing hole transport properties and OXD-7 possessing electron transport properties to form a mixed host material, and doping the host material with the phosphorescent metal complex of the present invention to prepare an emissive layer; at last, preparing sequentially a BmPyPB electron transport layer, a LiF electron injection layer, and an Al cathode layer by vacuum thermal evaporation.

According to the present invention, in the method, the films of the PEDOT:PSS hole injection layer, the Poly-TPD hole transport layer and the mCP or TCTA:OXD-7 emissive layer doped with the phosphorescent metal complex of the present invention are prepared by spin coating with solution; and the films of the BmPyPB electron transport layer and the LiF electron injection layer are prepared by vacuum thermal evaporation.

The organic light-emitting diode prepared by using the phosphorescent metal complex of the present invention has excellent performance, and has high electro-optical conversion efficiency.

The present invention further provides use of the organic light-emitting diode in the fields of flat-panel display and daily lighting.

Compared to the prior art, the present invention has the following advantages.

1) The introduction of substituents at ortho positions of phenyl rings of the triphosphine ligand increases the steric hindrance effect in the $PtM_2$ complex, which can more effectively inhibit thermally induced nonradiative transitions and thus significantly improve its phosphorescence efficiency, such as phosphorescence quantum yield;

2) The phosphorescent metal complex of the present invention exhibits strong phosphorescence in both solid and film. The organic light-emitting diode prepared by using the phosphorescent metal complex of the present invention as a dopant for an emissive layer has both a high maximum external quantum conversion efficiency and a high maximum current efficiency. Besides, the introduction of electron transport groups in organic alkyne ligands leads to narrower full widths at half maximum in spectra and significantly improves the luminescence purity.

3) In the present invention, the hole injection layer, the hole transport layer and the emissive layer of the organic light-emitting diode are prepared by using solution method, which can greatly reduce the manufacturing costs of devices;

4) In the present invention, a host material possessing hole transport properties is mixed with another host material possessing electron transport properties to form a mixed host material, which facilitates the transport of carriers in the emissive layer, and improves the energy transfer efficiency, thereby achieving high-efficiency organic electroluminescence.

Definitions and Description

Unless otherwise defined, all technical and scientific terms used herein have the same meaning as commonly understood by those skilled in the art to which the subject matter of the claims belong. It is to be understood that the brief description above and the detailed description below are exemplary and only for explanation, and do not limit the subject matter of the present application in any way. In the present application, unless otherwise specified, the term "or" used means "and/or". In addition, the terms "comprise", "include" and "contain", and other forms thereof such as "comprises", "comprising", includes", "including", "contains" and "containing" are not limiting.

The term "alkyl" refers to a linear or branched alkyl group having 1-12, preferably 1-10 carbon atoms, such as methyl, ethyl, propyl, isopropyl, butyl, isobutyl, tert-butyl, sec-butyl, pentyl and neopentyl.

The term "alkenyl" preferably refers to a linear or branched monovalent hydrocarbyl group comprising one or more double bonds and having 2-12 carbon atoms, and is preferably "$C_{2-10}$ alkenyl". The term "$C_{2-10}$ alkenyl" preferably refers to a linear or branched monovalent hydrocarbyl group comprising one or more double bonds and having 2, 3, 4, 5, 6, 7, 8, 9 or 10 carbon atoms, in particular 2 or 3 carbon atoms ("$C_{2-3}$ alkenyl"); it should be understood that when the alkenyl comprises more than one double bond, the double bonds can be separated from one another or conjugated. The alkenyl is, for example, ethenyl, allyl, (E)-2-methylethenyl, (Z)-2-methylethenyl, (E)-but-2-enyl, (Z)- but-2-enyl, (E)-but-1-enyl, (Z)-but-1-enyl, pent-4-enyl, (E)-pent-3-enyl, (Z)-pent-3-enyl, (E)-pent-2-enyl, (Z)-pent-2-enyl, (E)-pent-1-enyl, (Z)-pent-1-enyl, hex-5-enyl, (E)-hex-4-enyl, (Z)-hex-4-enyl, (E)-hex-3-enyl, (Z)-hex-3-enyl, (E)-hex-2-enyl, (Z)-hex-2-enyl, (E)-hex-1-enyl, (Z)-hex-1-enyl, isopropenyl, 2-methylprop-2-enyl, 1-methylprop-2-enyl, 2-methylprop-1-enyl, (E)-1-methylprop-1-enyl or (Z)-1-methylprop-1-enyl.

The term "alkynyl" refers to a linear or branched monovalent hydrocarbyl group comprising one or more triple bonds and having 2-12 carbon atoms, and is preferably "$C_2$-$C_{10}$ alkynyl". The term "$C_2$-$C_{10}$ alkynyl" refers to a linear or branched monovalent hydrocarbyl group comprising one or more triple bonds and having 2, 3, 4, 5, 6, 7, 8, 9 or 10 carbon atoms, in particular 2 or 3 carbon atoms ("$C_2$-$C_3$-alkynyl"). The alkynyl is, for example, ethynyl, prop-1-ynyl, prop-2-ynyl, but-1-ynyl, but-2-ynyl, but-3-ynyl, pent-1-ynyl, pent-2-ynyl, pent-3-ynyl, pent-4-ynyl, hex-1-ynyl, hex-2-ynyl, hex-3-ynyl, hex-4-ynyl, hex-5-ynyl, 1-methylprop-2-ynyl, 2-methylbut-3-ynyl, 1-methylbut-3-ynyl, 1-methylbut-2-ynyl, 3-methylbut-1-ynyl or 1-ethylprop-2-ynyl.

The term "aryl" preferably refers to an aromatic or partially aromatic monocyclic, bicyclic or tricyclic hydrocarbon ring having 5-20 carbon atoms, and is preferably "$C_{6-14}$ aryl". The term "$C_{6-14}$ aryl" preferably refers to an aromatic or partially aromatic monovalent monocyclic, bicyclic or tricyclic hydrocarbon ring having 6, 7, 8, 9, 10, 11, 12, 13 or 14 carbon atoms ("$C_{6-14}$ aryl"), in particular a ring having 6 carbon atoms ("$C_6$ aryl"), such as phenyl; or a biphenyl, a ring having 9 carbon atoms ("$C_9$ aryl") such as indanyl or indenyl, a ring having 10 carbon atoms ("$C_{10}$ aryl") such as tetrahydronaphthyl, dihydronaphthyl or naphthyl, a ring having 13 carbon atoms ("$C_{13}$ aryl") such as fluorenyl, or a ring having 14 carbon atoms ("$C_{14}$ aryl") such as anthracenyl.

The term "heteroaryl" refers to a monocyclic, bicyclic or tricyclic hydrocarbon ring having 5-20 ring atoms, 5-14 ring atoms, 5-12 ring atoms, 5-10 ring atoms or 5-6 ring atoms, wherein at least one ring system is aromatic, and at least one ring system contains one or more heteroatoms (such as N, O, S or Se); each ring system comprises a ring consisting of 5-7 atoms, with one or more linking sites connected to the rest of the molecule. The heteroaryl group is optionally substituted with one or more substituents described herein. In some embodiments, the heteroaryl consisting of 5-10 atoms contains 1, 2, 3 or 4 heteroatoms independently selected from O, S, Se and N. In other embodiments, the heteroaryl consisting of 5-6 atoms contains 1, 2, 3 or 4 heteroatoms independently selected from O, S, Se and N.

Examples of the heteroaryl include, but are not limited to, thienyl, furanyl, pyrrolyl, oxazolyl, thiazolyl, imidazolyl, pyrazolyl, isoxazolyl, isothiazolyl, oxadiazolyl, triazolyl, thiadiazolyl, thia-4H-pyrazolyl and the like and benzo derivatives thereof, such as benzofuranyl, benzothienyl, benzoxazolyl, benzoisoxazolyl, benzimidazolyl, benzotriazolyl, indazolyl, indolyl, and isoindolyl; or pyridinyl, pyridazinyl, pyrimidinyl, pyrazinyl, triazinyl and the like and benzo derivatives thereof, such as quinolyl, quinazolinyl, and isoquinolyl; or azocinyl, indolizinyl, purinyl and the like and benzo derivatives thereof; or cinnolinyl, phthalazinyl, quinazolinyl, quinoxalinyl, naphthyridinyl, pteridinyl, carbazolyl, dibenzofuranyl, dibenzothienyl, acridinyl, phenazinyl, phenothiazinyl, phenoxazinyl, and the like.

The term "alkoxy" refers to alkyl-O—, wherein the alkyl is defined as above.

The term "haloalkyl" refers to an alkyl group substituted with one or two or more halogens, wherein the alkyl is defined as above. The haloalkyl may be, for example, trifluoromethyl.

BRIEF DESCRIPTION OF THE DRAWING

The FIGURE is a schematic diagram showing the structure of a device and the chemical structure of an organic material.

DETAILED DESCRIPTION

In order to facilitate the understanding of the objects, technical scheme and technical effects of the present invention, the present invention is further described in detail below with reference to the drawing and examples.

In the following examples, dTolmp refers to PhP{CH$_2$P(C$_6$H$_4$Me-2)$_2$}$_2$, tht refers to tetrahydrothiophene.

TPA refers to diphenylaminophenyl, Carb refers to carbazolyl, BBF refers to

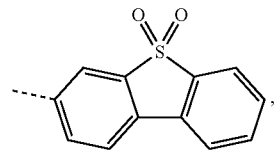

OXD refers to

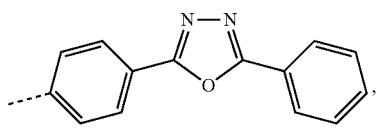

and SQ refers to

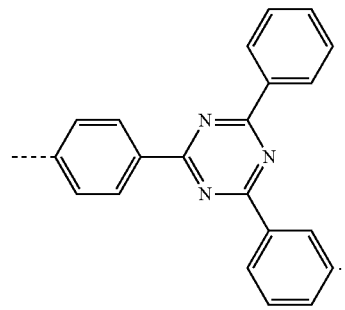

Example 1. Preparation of Complex [PtAu$_2$(dTolmp)$_2$(C≡CC$_6$H$_3$(OMe)$_2$-2,4)$_2$](CF$_3$SO$_3$)$_2$ (1)

To a solution of [Au(tht)$_2$](CF$_3$SO$_3$) (0.1 mmol) in dichloromethane (20 mL) was added dTolmp (0.1 mmol). After being stirred for 30 min, the above solution was added with a solution of Pt(PPh$_3$)$_2$(C≡CC$_6$H$_3$(OMe)$_2$-2,4)$_2$ (0.05 mmol)

in dichloromethane (5 mL). The reaction system was stirred at room temperature for 4 h. The crude product was purified by silica gel column chromatography (eluent: $CH_2Cl_2$-MeCN (8:1)) to give a pure product in 83% yield. HRMS cald. for $[M-2CF_3SO_3]^{2+}$: 1018.2208, found: 1018.2207. $^3H$ NMR ($CD_2Cl_2$, ppm): 8.12-8.09 (m, 4H), 7.77-7.72 (m, 4H), 7.37-7.31 (m, 8H), 7.18-7.14 (m, 14H), 6.98-6.91 (m, 8H), 6.76-6.72 (t, 4H), 6.67-6.65 (d, 2H), 6.43-6.37 (m, 4H), 5.04-5.01 (m, 8H), 3.90, 3.86 (s, 12H), 2.22, 2.13 (s, 24H). $^{31}P$ NMR ($CD_2Cl_2$, ppm): 20.28 (m, 4P, $J_{P\text{-}P}$=33.10 Hz), 8.24 (m, 2P, $J_{Pt\text{-}P}$=2561 Hz, $J_{P\text{-}P}$=32.54 Hz). Infrared spectrum (KBr, cm$^{-1}$): 2104 (w), 1253 (m), 1148 (m), 1027 (s).

Example 2. Preparation of Complex $[PtAg_2(dTolmp)_2(C\equiv C\text{-}4\text{-}TPA)_2](ClO_4)_2$ (2)

To a solution of $[Ag(tht)](ClO_4)$ (0.1 mmol) in dichloromethane (20 mL) was added dTolmp (0.1 mmol). After being stirred for 30 min, the above solution was added with a solution of $Pt(PPh_3)_2(C\equiv C\text{-}4\text{-}TPA)_2$ (0.05 mmol) in dichloromethane (5 mL). The reaction system was stirred at room temperature for 4 h. The crude product was purified by silica gel column chromatography (eluent: $CH_2Cl_2$-MeCN (8:1)) to give a pure product in 78% yield. HRMS cald. for $[M-2ClO_4]^{2+}$: 1036.2117, found: 1036.2098. $^3H$ NMR ($CD_2Cl_2$, ppm): 8.12-7.90 (m, 7H), 7.65-7.58 (m, 4H), 7.46-6.94 (m, 44H), 6.88-6.58 (m, 12H), 6.39-6.25 (m, 3H), 6.66-6.62 (t, 2H), 6.59-6.56 (m, 3H), 6.43-6.41 (d, 1H), 6.22-6.16 (m, 3H), 4.73-4.04 (m, 8H), 2.16-2.01 (m, 24H). $^{31}P$ NMR ($CD_2Cl_2$, ppm): 12.94, 11.50 (m, 2P, $J_{Pt\text{-}P}$=2442 Hz, $J_{Pt\text{-}P}$=2407 Hz, $J_{P\text{-}P}$=33.3 Hz), −12.25, −16.10, −19.32 (m, 4P, $J_{Ag\text{-}P}$=522 Hz, $J_{P\text{-}P}$=35.4 Hz). Infrared spectrum (KBr, cm$^{-1}$): 2087 (w), 1100 (s).

Example 3. Preparation of Complex $[PtAg_2(dTolmp)_2(C\equiv C\text{-}4\text{-}Ph\text{-}9\text{-}Carb)_2](CF_3SO_3)_2$ (3)

To a solution of $[Ag(tht)](ClO_4)$ (0.1 mmol) in dichloromethane (20 mL) was added dTolmp (0.1 mmol). After being stirred for 30 min, the above solution was added with a solution of $Pt(PPh_3)_2(C\equiv C\text{-}4\text{-}Ph\text{-}9\text{-}Carb)_2$ (0.05 mmol) in dichloromethane (5 mL). The reaction system was stirred at room temperature for 4 h. The crude product was purified by silica gel column chromatography (eluent: $CH_2Cl_2$-MeCN (8:1)) to give a pure product in 80% yield. HRMS cald. for $[M-2 CF_3SC)_3]^{2+}$: 1034.1960, found: 1034.1960. $^1H$ NMR ($CD_2Cl_2$, ppm): 8.26-8.17 (m, 11H), 7.83-7.71 (m, 4H), 7.58-7.32 (m, 24H), 7.29-7.05 (m, 18H), 7.00-6.93 (m, 4H), 6.87-6.73 (m, 4H), 6.56-6.54 (d, 1H), 4.98-4.27 (m, 8H), 2.31-2.12 (m, 24H). $^{31}P$ NMR ($CD_2Cl_2$, ppm): 12.93 and 12.03 (m, 2P, $J_{Pt\text{-}P}$=2431 Hz, $J_{Pt\text{-}P}$=2386 Hz, $J_{P\text{-}P}$=33.2 Hz), −12.39, −16.31, −19.52 (m, 4P, $J_{Ag\text{-}P}$=522 Hz, $J_{P\text{-}P}$=43.5 Hz). Infrared spectrum (KBr, cm$^{-1}$): 2096 (w), 1258 (m), 1150 (m), 1030 (s).

Example 4. Preparation of Complex $[PtAg_2(dTolmp)_2(C\equiv C\text{—}BBF)_2](ClO_4)_2$ (4)

To a solution of $[Ag(tht)](ClO_4)$ (0.1 mmol) in dichloromethane (20 mL) was added dTolmp (0.1 mmol). After being stirred for 30 min, the above solution was added with a solution of $Pt(PPh_3)_2(C\equiv C\text{—}BBF)_2$ (0.05 mmol) in dichloromethane (5 mL). The reaction system was stirred at room temperature for 4 h. The crude product was purified by silica gel column chromatography (eluent: $CH_2Cl_2$-MeCN (8:1)) to give a pure product in 77% yield. HRMS cald. for $[M-2ClO_4]^{2+}$: 1007.1154, found: 1007.1153. $^1H$ NMR ($CD_2Cl_2$, ppm): 8.21-8.07 (m, 7H), 7.91-7.80 (m, 4H), 7.76-7.59 (m, 12H), 7.50-7.36 (m, 7H), 7.30-7.04 (m, 17H), 6.95-6.74 (m, 8H), 6.17 (s, 1H), 4.88-4.16 (m, 8H), 2.27-2.05 (m, 24H). $^{31}P$ NMR ($CD_2Cl_2$, ppm): 12.20 (m, 2P, $J_{Pt\text{-}P}$=2423 Hz, $J_{P\text{-}P}$=36.4 Hz), −9.96, −13.16 −15.66, −18.74 (m, 4P, $J_{Ag\text{-}P}$=522 Hz). Infrared spectrum (KBr, cm$^{-1}$): 2098 (w), 1082 (m).

Example 5. Preparation of Complex $[PtAg_2(dTolmp)_2(C\equiv C\text{-}OXD)_2](ClO_4)_2$ (5)

To a solution of $[Ag(tht)](ClO_4)$ (0.1 mmol) in dichloromethane (20 mL) was added dTolmp (0.1 mmol). After being stirred for 30 min, the above solution was added with a solution of $Pt(PPh_3)_2(C\equiv C\text{—}OXD7)_2$ (0.05 mmol) in dichloromethane (5 mL). The reaction system was stirred at room temperature for 4 h. The crude product was purified by silica gel column chromatography (eluent: $CH_2Cl_2$-MeCN (8:1)) to give a pure product in 80% yield. HRMS cald. for $[M\text{-}2\ ClO_4]^{2+}$: 1013.1705, found: 1013.1704. $^1H$ NMR ($CD_2Cl_2$, ppm): 8.21-8.05 (m, 11H), 7.95-7.89 (m, 3H), 7.73-7.51 (m, 14H), 7.45-7.39 (m, 5H), 7.26-6.97 (m, 18H), 6.89-6.87 (d, 2H), 6.82-6.67 (m, 5H), 4.88-4.16 (m, 8H), 2.13-2.03 (m, 24H). $^{31}P$ NMR ($CD_2Cl_2$, ppm): 12.41, 11.53 (m, 2P, $J_{Pt\text{-}P}$=2427 Hz, $J_{P\text{-}P}$=36.2 Hz), −11.44, −14.67, −16.23, −19.55 (m, 4P, $J_{Ag\text{-}P}$=519 Hz). Infrared spectrum (KBr, cm-1): 2095 (w), 1080 (s).

Example 6. Preparation of Complex $[PtAg_2(dTolmp)_2(C\equiv C\text{-}SQ)_2](CF_3SO_3)_2$ (6)

To a solution of $[Ag(tht)](CF_3SO_3)$ (0.1 mmol) in dichloromethane (20 mL) was added dTolmp (0.1 mmol). After being stirred for 30 min, the above solution was added with a solution of $Pt(PPh_3)_2(C\equiv C\text{-}SQ)_2$ (0.05 mmol) in dichloromethane (5 mL). The reaction system was stirred at room temperature for 4 h. The crude product was purified by silica gel column chromatography (eluent: $CH_2Cl_2$-MeCN (8:1)) to give a pure product in 82% yield. HRMS cald. for $[M-2CF_3SO_3]^{2+}$: 1100.2179, found: 1100.2168. $^3H$ NMR ($CD_2Cl_2$, ppm): 8.87-8.80 (m, 5H), 8.61-8.59 (m, 2H), 8.36-8.16 (m, 9H), 7.83-7.58 (m, 19H), 7.52-7.43 (m, 5H), 7.36-7.03 (m, 18H), 6.93-6.91 (d, 3H), 6.86-6.74 (m, 4H), 6.57-6.55 (d, 2H), 4.98-4.26 (m, 8H), 2.30-2.09 (m, 24H). $^{31}P$ NMR, ($CD_2Cl_2$, ppm): 12.57, 11.70 (m, 2P, $J_{Pt\text{-}P}$=2424 Hz, $J_{P\text{-}P}$=34.6 Hz), −11.95, −15.19, −16.36, −19.58 (m, 4P, $J_{Ag\text{-}P}$=517 Hz). Infrared spectrum (KBr, cm$^{-1}$): 2100 (w), 1030 (s), 1153 (s), 1257 (s).

Example 7. Measurement of Photoluminescence Performance

The excitation spectra, emission spectra, luminescence lifetimes and luminescence quantum yields of complexes 1-6 prepared in Examples 1-6 were measured on an Edinburgh FLS920 fluorescence spectrometer in solutions in deoxygenated dichloromethane, solid powders and films of 94 wt % of mCP:6 wt % of the complexes 1-6 of the present invention, wherein, the excitation spectra, emission spectra, luminescence lifetimes and luminescence quantum yields in solutions were measured in a cuvette containing 2×10$^{-5}$ M solution in dichloromethane; the luminescence quantum yields of the solid powders were measured in an integrating sphere with a diameter of 142 mm; the luminescence quantum yields of the films of 94 wt % of mCP:6 wt % of the complexes 1-6 of the present invention prepared by spin coating with solutions in dichloromethane were measured in an integrating sphere with a diameter of 142 mm.

The complexes 1-6 exhibit strong phosphorescence in all the solutions, solids and films. For example:

The emission wavelengths, luminescence lifetimes and quantum yields of the complexes 1-6 in solutions in dichloromethane are 547 nm, 0.63 µs and 38.7% (1); 621 nm, 0.58 µs and 17.5% (2); 530 nm, 0.37 µs and 10.3% (3); 534 nm, 1.35 µs and 31.5% (4); 522 nm, 0.96 µs and 21.2% (5); and 517 nm, 0.95 µs and 19.4% (6), respectively;

the emission wavelengths, luminescence lifetimes and quantum yields of the complexes 1-6 in solid powders are 562 nm, 0.74 µs and 34.5% (1); 582 nm, 1.67 µs and 31.8% (2); 534 nm, 2.01 µs and 38.9% (3); 535 nm, 2.15 µs and 13.9% (4); 526 nm, 2.08 µs and 20.91 (5); and 522 nm, 2.56 µs and 11.2% (6), respectively;

the emission wavelengths, luminescence lifetimes and quantum yields of the complexes 1-6 in films of 94 wt % of mCP:6 wt % of the complexes of the present invention are 537 nm, 0.73 µs and 99.3% (1); 573 nm, 2.18 µs and 92.0% (2); 522 nm, 1.94 µs and 93.6% (3); 533 nm, 8.90 µs and 76.1% (4); 523 nm, 5.40 and 80.2% (5); and 515 nm, 4.07 µs and 90.6% (6), respectively.

Example 8. Preparation of Organic Light-Emitting Diode Device and Measurement of Electroluminescence Performance The phosphorescent complexes 1-6 prepared in Examples 1-6 were doped at 6 wt % in a mixed host material of TCTA:OXD-7 or mCP:OXD-7 as the emissive layers to prepare organic light-emitting diodes, and the devices had the following structures: ITO/PEDOT:PSS (50 nm)/Poly-TPD (50 nm)/47 wt % of TCTA:47 wt % of OXD-7:6 wt % of the complex 1 or 2 (50 nm)/BmPyPB (50 nm)/LiF (1 nm)/Al (100 nm) and ITO/PEDOT:PSS (50 nm)/Poly-TPD (50 nm)/47 wt % of mCP:47 wt % of OXD-7:6 wt % of the complexes 3-6 of the present invention (50 nm)/BmPyPB (50 nm)/LiF (1 nm)/Al (100 nm).

The ITO substrate was cleaned with deionized water, acetone and isopropanol sequentially, and then treated with UV-ozone for 15 min. The ITO substrate was spin-coated with a filtered aqueous solution of PEDOT:PSS in a spin coater at 4800 rpm and dried at 130.° C. for 20 min to form a hole injection layer with a thickness of 40 nm; the PEDOT:PSS film was then spin-coated with a filtered 2 mg/mL Poly-TPD in a spin coater at 2800 rpm to form a hole transport layer with a thickness of 50 nm; the Poly-TPD film was then spin-coated with a filtered 5 mg/mL solution of 47 wt % of TCTA:47 wt % of OXD-7:6 wt % of the complex 1 or 2 of the present invention in dichloromethane and 5 mg/mL solution of 47 wt % of mCP:47 wt % of OXD-7:6 wt % of the complex 3, 4, 5, or 6 of the present invention in dichloromethane in a spin coater at 2000 rpm to form an emissive layer with a thickness of 50 nm. Subsequently, onto the ITO substrate were thermally evaporated in sequence BmPyPB to form an electron transport layer with a thickness of 50 nm, LiF to form an electron injection layer with a thickness of 1 nm and Al to form a cathode with a thickness of 100 nm, in a vacuum chamber with the vacuum degree being no less than $4 \times 10^{-4}$ Pa.

The performance of the light-emitting diode device was measured in a dry air environment at room temperature. The electroluminescence performance parameters of Examples 1-6 including electroluminescence wavelength ($\lambda_{EL}$), turn-on voltage ($V_{on}$), maximum brightness ($L_{max}$), maximum current efficiency ($CE_{max}$), maximum power efficiency ($PE_{max}$) and maximum external quantum efficiency ($EQE_{max}$) are listed in Table 1.

TABLE 1

Performance of electroluminescence devices prepared by using the phosphorescent complexes 1-6 of the present invention[a]

| Complex | $\lambda_{EL}$ [nm] | $V_{on}$[b] [V] | $L_{max}$[c] [cd/m$^2$] | $CE_{max}$[d] [cd/A] | $PE_{max}$[e] [lm/W] | $EQE_{max}$[f] [%] | FWHM[g] [nm] |
|---|---|---|---|---|---|---|---|
| 1 | 536 | 3.0 | 33041 | 96.2 | 65.0 | 26.4 | 60 |
| 2 | 579 | 3.8 | 6117 | 69.0 | 36.1 | 21.7 | 85 |
| 3 | 522 | 4.1 | 16849 | 63.4 | 33.2 | 17.6 | 67 |
| 4 | 532 | 3.8 | 6817 | 51.3 | 29.3 | 13.0 | 31 |
| 5 | 524 | 4.1 | 11865 | 69.5 | 42.8 | 18.2 | 37 |
| 6 | 517 | 3.8 | 12820 | 61.7 | 35.2 | 16.7 | 40 |

[a]The emissive layer of the device prepared by using the complexes 1 or 2 is formed of TCTA (47 wt %):OXD-7 (47 wt %):the complex 1 or 2 (6 wt %); the emissive layer of the device prepared by using the complex 3, 4, 5 or 6 is formed of mCP (47 wt %):OXD-7 (47 wt %):the complex 3, 4, 5 or 6 (6 wt %).

[b]Turn-on voltage at a brightness of 1 cd/m$^2$.

[c]Maximum brightness.

[d]Maximum current efficiency.

[e]Maximum power efficiency.

[f]Maximum external quantum efficiency.

[g]Full width at half maximum in electroluminescence spectrum.

The invention claimed is:

1. A phosphorescent metal complex of formula (I) below:

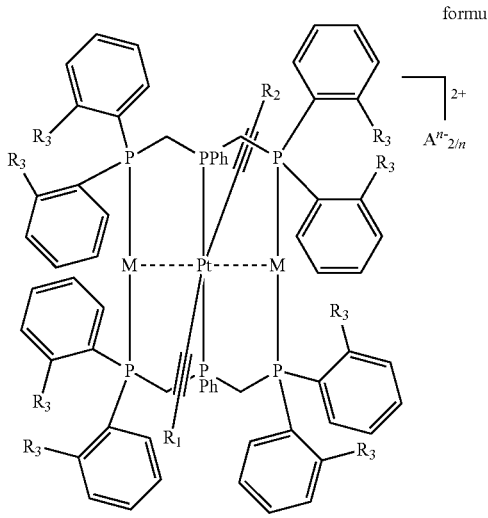

formula (I)

wherein $R_1$ and $R_2$ are the same or different, and are independently selected from aryl, heteroaryl and heteroarylaryl, wherein the aryl and heteroaryl are optionally substituted with one to five substituents selected from halogen, alkyl, alkoxy, alkylthio, amino, alkylamino, dialkylamino, arylamino, diarylamino, haloalkyl, cyano, nitro, alkenyl, alkynyl, aryl, and heteroaryl optionally substituted with one to three aryl groups;

$R_3$ is the same or different, and is independently selected from halogen, alkyl, haloalkyl, alkoxy, alkylthio, amino, alkylamino, dialkylamino, cyano, nitro, alkenyl, and alkynyl;

M is Cu(I), Ag(I) or Au(I); and $A^{n-}$ is an anionic group, wherein n is 1 or 2.

2. The phosphorescent metal complex according to claim 1, wherein $A^{n-}$ is $ClO_4^-$, $PF_6^-$, $SbF_6^-$, $BF_4^-$, $SiF_6^{2-}$, $CF_3SO^{3-}$, $CF_3CF_2CF_2CF_2SO_3^-$, or dicyclohexyl succinate-2-sulfonate.

3. The phosphorescent metal complex according to claim 1, wherein $R_1$ and $R_2$ are independently selected from aryl and heteroaryl, wherein the aryl and heteroaryl are optionally substituted with one to three substituents selected from alkyl, alkoxy, halogen, haloalkyl, amino, arylamino, diarylamino, aryl, heteroaryl, and heteroaryl substituted with one or two aryl groups.

4. The phosphorescent metal complex according to claim 1, wherein the aryl is phenyl, naphthyl, phenanthryl, or anthryl; and the heteroaryl is thienyl, furanyl, dibenzothienyl, oxodibenzothienyl, carbazolyl, oxadiazolyl, or triazinyl.

5. The phosphorescent metal complex according to claim 1, wherein $R_1$ and $R_2$ are independently selected from heteroaryl, aryl, alkoxyaryl, dialkoxyaryl, trialkoxyaryl, heteroarylaryl, arylheteroarylaryl, and diarylheteroarylaryl.

6. The phosphorescent metal complex according to claim 1, wherein $R_1$ and $R_2$ are independently selected from methoxyaryl, dimethoxyaryl, trimethoxyaryl, carbazolylaryl, aryloxadiazolylaryl, and diaryltriazinylaryl.

7. The phosphorescent metal complex according to claim 1, wherein $R_1$ and $R_2$ are independently selected from alkoxy-phenyl, dialkoxy-phenyl, trialkoxy-phenyl, heteroaryl-phenyl, diarylaminophenyl, arylheteroarylphenyl, and diarylheteroarylphenyl.

8. The phosphorescent metal complex according to claim 1, wherein $R_1$ and $R_2$ are independently selected from phenyl, naphthyl, carbazolyl, 2-methoxy-phenyl, 3-methoxy-phenyl, 4-methoxy-phenyl, 2,4-dimethoxy-phenyl, 3,4,5-trimethoxy-phenyl, diphenylaminophenyl, carbazolylphenyl, dibenzothienyl, oxodibenzothienyl, phenyloxadiazolylphenyl, and diphenyl-s-triazinylphenyl.

9. The phosphorescent metal complex according to claim 1, wherein $R^3$ is independently selected from alkyl.

10. The phosphorescent metal complex according to claim 1, wherein $R_1$ and $R_2$ are the same.

11. The phosphorescent metal complex according to claim 1, selected from the following complexes 1-6:

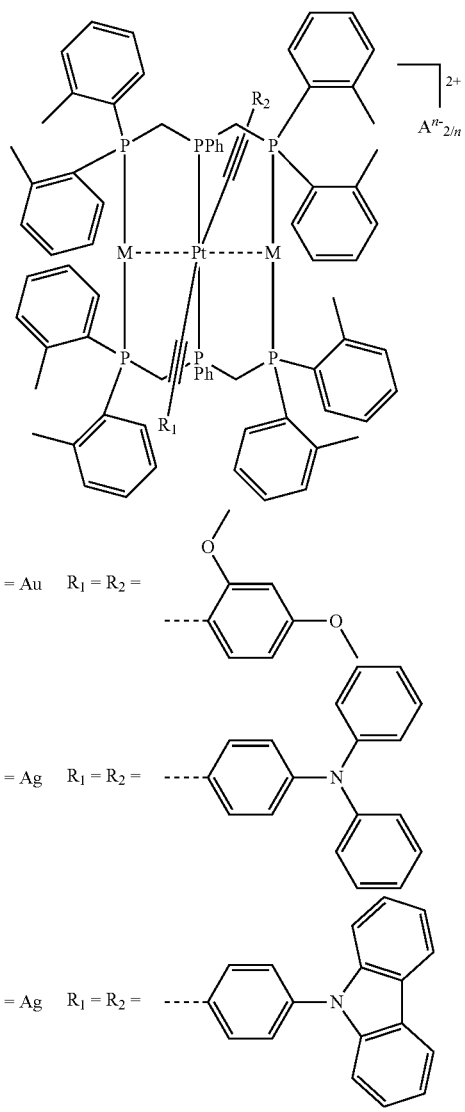

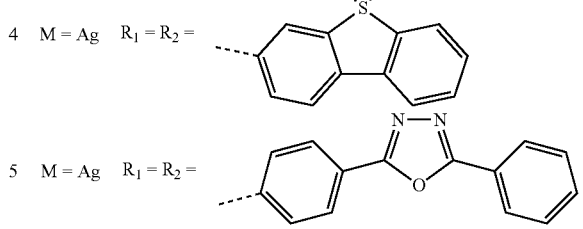

-continued

6   M = Ag   $R_1 = R_2 =$ 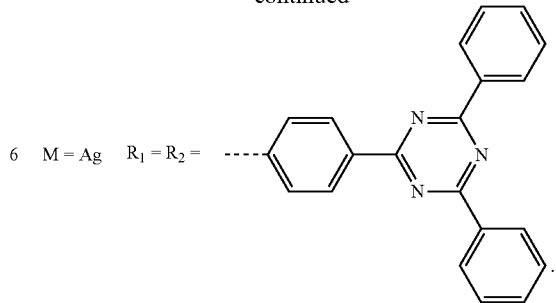

12. A method for preparing the phosphorescent metal complex according to claim 1, comprising:
dissolving $PhP(CH_2P(C_6H_4R_3\text{-}2)_2)_2$ and $[M(tht)_2](A''^-_{1/n})$ in a solvent, and then adding platinum-organic alkyne complex $Pt(PPh_3)_2(C\equiv CR_1)(C\equiv CR_2)$ to form the phosphorescent complex, wherein the tht represents tetrahydrothiophene.

13. An organic light-emitting diode comprising an emissive layer, wherein the emissive layer comprises the phosphorescent metal complex according to claim 1.

14. The organic light-emitting diode according to claim 13, wherein in the emissive layer comprises is 3 wt %-20 wt % of the phosphorescent metal complex based on a total weight of the emissive layer.

15. The organic light-emitting diode according to claim 13, wherein the organic light-emitting diode comprising an anode layer, a hole injection layer, a hole transport layer, the emissive layer, an electron transport layer, an electron injection layer and a cathode layer.

16. The organic light-emitting diode according to claim 15, wherein:
the anode layer is formed of indium tin oxide; the hole injection layer is formed of PEDOT:PSS (poly(3,4-ethylenedioxythiophene)-poly(styrene sulfonic acid));
the hole transport layer is formed of Poly-TPD (poly(bis(4-phenyl)(4-butylphenyl)amine));
the emissive layer comprises the phosphorescent metal complex, a material having hole transport properties selected from TCTA (tris(4-(9-carbazole)phenyl)amine), mCP (1,3-bis(9-carbazolyl)benzene), CBP (4,4'-bis(9-carbazole)-1,1'-biphenyl) or 2,6-DCZPPY (2,6-bis(3-(9-carbazole)phenyl)pyridine), and a material having electron transport properties that is OXD-7 (1,3-bis(5-(4-(tert-butyl)phenyl)-1,3,4-oxadiazol-2-yl)benzene);
the electron transport layer is formed of BmPyPB (1,3,5-tris(1-phenyl-1H-benzo[d]imidazol-2-yl)benzene), BmPyPB (3,3",5,5"-tetra(3-pyridinyl)-1,1':3',1"-terphenyl), BCP (2,9-dimethyl-4,7-diphenyl-1,10-phenanthroline), or OXD-7;
the electron injection layer is formed of LiF; and
the cathode layer is formed of Al.

17. The organic light-emitting diode according to claim 16, wherein the organic light-emitting diode has the following structure: ITO/PEDOT:PSS/Poly-TPD/mCP:OXD-7:6 wt % of the phosphorescent metal complex /BmPyPB/LiF/Al or ITO/PEDOT: PSS/Poly-TPD/TCTA:OXD-7:6 wt % of the phosphorescent metal complex/BmPyPB/LiF/Al.

* * * * *

UNITED STATES PATENT AND TRADEMARK OFFICE
CERTIFICATE OF CORRECTION

PATENT NO. : 12,207,545 B2
APPLICATION NO. : 17/405229
DATED : January 21, 2025
INVENTOR(S) : Zhongning Chen et al.

Page 1 of 1

It is certified that error appears in the above-identified patent and that said Letters Patent is hereby corrected as shown below:

On the Title Page

Item [73], Line 4 reading:
-ACADEMY-
Should be changed to:
--ACADEMY OF SCIENCES--.

Signed and Sealed this
Eighth Day of April, 2025

Coke Morgan Stewart
*Acting Director of the United States Patent and Trademark Office*